(12) United States Patent
Saliaris

(10) Patent No.: US 7,857,214 B2
(45) Date of Patent: Dec. 28, 2010

(54) INTELLIGENT TRACK SYSTEM FOR MOUNTING ELECTRONIC EQUIPMENT

(75) Inventor: David G. Saliaris, Lewis Center, OH (US)

(73) Assignee: Liebert Corporation, Columbus, OH (US)

( * ) Notice: Subject to any disclaimer, the term of this patent is extended or adjusted under 35 U.S.C. 154(b) by 506 days.

(21) Appl. No.: 11/873,236

(22) Filed: Oct. 16, 2007

(65) Prior Publication Data

US 2008/0265722 A1 Oct. 30, 2008

Related U.S. Application Data

(60) Provisional application No. 60/914,119, filed on Apr. 26, 2007.

(51) Int. Cl.
*G06K 15/00* (2006.01)
(52) U.S. Cl. .................. 235/383; 235/385; 340/572.1; 361/800
(58) Field of Classification Search .............. 235/381, 235/383, 385, 375, 440, 441, 449, 451; 361/724–727, 361/721, 752, 790, 794, 796, 797, 800; 340/572.1, 340/686.1, 686.4, 687, 10.1, 10.3, 545.2, 340/545.3, 545.4, 547, 551, 552, 561, 562, 340/572.4, 825.49
See application file for complete search history.

(56) References Cited

U.S. PATENT DOCUMENTS 4,350,980 A * 9/1982 Ward ..................... 340/870.02
5,281,859 A 1/1994 Crane (Continued)

FOREIGN PATENT DOCUMENTS

WO 9310615 5/1993

(Continued)

OTHER PUBLICATIONS

Rasmussen, N., "Cooling Strategies for Ultra-High Density Racks and Blade Servers", White Paper #46, American Power Conversion, 2005, [retrieved from the Internet on Oct. 13, 2009 using <URL: http://www.apcmedia.com/salestools/SADE-5TNRK6_R4_EN.pdf>].

(Continued)

*Primary Examiner*—Michael G Lee
*Assistant Examiner*—Suezu Ellis
(74) *Attorney, Agent, or Firm*—Locke Lord Bissell & Liddell LLP

(57) ABSTRACT

The present invention provides an intelligent track system generally mounted in a network, server, or telecom rack/enclosure rack rail that can sense the spaces, such as "U" spaces, used by electronic equipment, shelving, or blanking panels and provide such information to a remote location. Information technology (IT) managers and other decision-makers can remotely view the actual available spaces and determine appropriate locations for installing additional equipment. Criteria can be based on actual available space and for some embodiments in conjunction with predictive or actual sensed temperatures proximate to the spaces, available cooling capacity, power loads, and available power capacity. In at least one embodiment, the intelligent mounting track system can include a plurality of sensors mounted along the rack surfaces that collectively or individually uniquely identify which spaces are occupied. The information can be communicated to an electronic processor with software to interpret the data and indicate space utilization.

18 Claims, 5 Drawing Sheets

U.S. PATENT DOCUMENTS

| | | | |
|---|---|---|---|
| 5,424,903 | A | 6/1995 | Schreiber |
| 5,682,949 | A | 11/1997 | Ratcliffe et al. |
| 5,850,539 | A | 12/1998 | Cook et al. |
| 5,862,393 | A | 1/1999 | Davis |
| 5,995,729 | A | 11/1999 | Hirosawa et al. |
| 6,134,511 | A | 10/2000 | Subbarao |
| 6,410,994 | B1 | 6/2002 | Jones et al. |
| 6,445,087 | B1 | 9/2002 | Wang et al. |
| 6,574,104 | B2 | 6/2003 | Patel et al. |
| 6,608,406 | B2 | 8/2003 | Bersiek |
| 6,618,772 | B1 | 9/2003 | Kao et al. |
| 6,628,009 | B1* | 9/2003 | Chapel ............. 307/14 |
| 6,711,613 | B1 | 3/2004 | Ewing et al. |
| 6,714,977 | B1 | 3/2004 | Fowler et al. |
| 6,718,277 | B2 | 4/2004 | Sharma |
| 6,721,672 | B2 | 4/2004 | Spitaels et al. |
| 6,741,442 | B1 | 5/2004 | McNally et al. |
| 6,744,150 | B2 | 6/2004 | Rendic |
| 6,826,036 | B2 | 11/2004 | Pereira |
| 6,826,922 | B2* | 12/2004 | Patel et al. ............ 62/185 |
| 6,862,179 | B2 | 3/2005 | Beitelmal et al. |
| 6,889,345 | B2* | 5/2005 | Sicola et al. ............ 714/43 |
| 6,937,461 | B1 | 8/2005 | Donahue |
| 6,967,283 | B2 | 11/2005 | Rasmussen et al. |
| 6,977,587 | B2* | 12/2005 | Pradhan et al. ....... 340/539.26 |
| 7,010,589 | B2 | 3/2006 | Ewing et al. |
| 7,020,586 | B2 | 3/2006 | Snevely |
| 7,031,870 | B2 | 4/2006 | Sharma |
| 7,043,543 | B2 | 5/2006 | Ewing et al. |
| 7,051,946 | B2 | 5/2006 | Bash et al. |
| 7,071,825 | B2* | 7/2006 | VoBa ............ 340/572.1 |
| 7,099,934 | B1 | 8/2006 | Ewing et al. |
| 7,141,891 | B2 | 11/2006 | McNally et al. |
| 7,162,521 | B2 | 1/2007 | Ewing et al. |
| 7,171,461 | B2 | 1/2007 | Ewing et al. |
| 7,196,900 | B2 | 3/2007 | Ewing et al. |
| 7,233,241 | B2* | 6/2007 | Overhultz et al. ....... 340/539.2 |
| 7,268,998 | B2 | 9/2007 | Ewing et al. |
| 7,313,503 | B2 | 12/2007 | Nakagawa et al. |
| 7,436,303 | B2* | 10/2008 | Tourrilhes et al. ....... 340/572.1 |
| 7,461,273 | B2* | 12/2008 | Moore et al. ............ 713/300 |
| 7,472,043 | B1 | 12/2008 | Low et al. |
| 7,596,476 | B2 | 9/2009 | Rasmussen et al. |
| 7,610,206 | B2* | 10/2009 | Kuhlmann et al. ............ 705/1.1 |
| 2003/0046339 | A1* | 3/2003 | Ip ............ 709/203 |
| 2003/0115024 | A1 | 6/2003 | Snevely |
| 2003/0122683 | A1 | 7/2003 | Downer |
| 2003/0154312 | A1* | 8/2003 | Berglund et al. ............ 709/250 |
| 2003/0158718 | A1 | 8/2003 | Nakagawa et al. |
| 2004/0165358 | A1 | 8/2004 | Regimbal et al. |
| 2004/0178270 | A1 | 9/2004 | Pradhan et al. |
| 2005/0023363 | A1 | 2/2005 | Sharma et al. |
| 2005/0203987 | A1 | 9/2005 | Ewing et al. |
| 2005/0259383 | A1 | 11/2005 | Ewing et al. |
| 2006/0097863 | A1* | 5/2006 | Horowitz et al. ............ 340/521 |
| 2006/0112286 | A1 | 5/2006 | Whalley et al. |
| 2007/0038414 | A1 | 2/2007 | Rasmussen et al. |
| 2007/0067203 | A1* | 3/2007 | Gil et al. ............ 705/10 |
| 2007/0078635 | A1 | 4/2007 | Rasmussen et al. |
| 2007/0174024 | A1 | 7/2007 | Rasmussen et al. |
| 2008/0068173 | A1* | 3/2008 | Alexis et al. ............ 340/572.7 |
| 2008/0272887 | A1* | 11/2008 | Brey et al. ............ 340/10.1 |
| 2009/0108995 | A1* | 4/2009 | Tucker et al. ............ 340/10.1 |

FOREIGN PATENT DOCUMENTS

| | | |
|---|---|---|
| WO | 0069081 | 11/2000 |

OTHER PUBLICATIONS

Rasmussen, N., "Strategies for Deploying Blade Servers in Existing Data Centers", White Paper #125, American Power Conversion, 2005, [retrieved from the Internet on Oct. 13, 2009 using <URL: http://www.apcmedia.com/salestools/NRAN-69M6RX_R0_EN.pdf>].

Dunlap, K, "Cooling Audit for Identifying Potential Cooling Problems in Data Centers", White Paper #40 Revision 2, American Power Conversion, 2006, [retrieved from the Internet on Oct. 13, 2009 using <URL: http://www.apcmedia.com/salestools/VAVR-5UGVCN_R2_EN.pdf>].

Rasmussen, N., "Calculating Total Cooling Requirements for Data Centers", White Paper #25 Revision 2, American Power Conversion, 2007, [retrieved from the Internet on Oct. 13, 2009 using <URL: http://www.apcmedia.com/salestools/NRAN-5TE6HE_R2_EN.pdf>].

Rasmussen, N., "Management Strategy for Network Critical Physical Infrastructure", White Paper #100, American Power Conversion, 2003, [retrieved from the Internet on Oct. 13, 2009 using <URL: http://www.ptsdcs.com/whitepapers/69.pdf>].

Innovative Research, Inc., Apr. 5, 2005, [retrieved from the Internet on Oct. 13, 2009 using <URL: http://web.archive.org/web/20050405003224/http://www.inres.com/index.html>].

Sharma, R., Bash, C., and Patel, C., "Dimensionless Parameters for Evaluation of Thermal Design and Performance of Large-Scale Data Centers", American Institute of Aeronautics and Astronautics, 2002, [retrieved from the Internet on Oct. 13, 2009 using <URL: https://eprints.kfupm.edu.sa/35051/1/35051.pdf>].

Florian Schneider, International Search Report for International Patent Application No. PCT/US2007/082996, European Patent Office, The Netherlands, dated Apr. 10, 2008.

Florian Schneider, Written Opinion for International Patent Application No. PCT/US2007/082996, European Patent Office, The Netherlands, dated Apr. 10, 2008.

G. Anastassiades, International Search Report for International Patent Application No. PCT/US2007/086809, European Patent Office, Germany, dated Jun. 9, 2008.

G. Anastassiades, Written Opinion for International Patent Application No. PCT/US2007/086809, European Patent Office, Germany, dated Jun. 9, 2008.

* cited by examiner

US 7,857,214 B2

INTELLIGENT TRACK SYSTEM FOR MOUNTING ELECTRONIC EQUIPMENT

CROSS REFERENCE TO RELATED APPLICATIONS

This application claims the benefit of U.S. Provisional Application Ser. No. 60/914,119, filed Apr. 26, 2007, which is incorporated herein by reference.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

1. Field of the Invention

The present invention relates generally to electronic equipment cabinets and racks, and more particularly to racks having multiple mounting locations for the equipment.

2. Description of the Related Art

With the expansion of telecommunication and computer technology, increasing amounts of electronic equipment are required at businesses and other facilities. Typically, the equipment is coupled to racks as shown in FIG. 1. The equipment is generally organized in a cabinet 2 of standard dimensions with multiple vertical racks 4 to support columns of equipment. A plurality of standardized preset spaces 26 (where three (3) standardized spaces are sometimes referred to as a "U" space) can be used to mount the equipment. The cabinet 2 generally includes sides 6, back 8, top 10, bottom 12, and front 14. The front 14 generally includes a door to gain access to the equipment therein. Power rails, uninterruptible power supplies, and other features can be coupled to the racks or cabinet. To conserve space, the racks and cabinets are increasingly becoming loaded with a higher density of electronic equipment. This equipment generates heat and consumes power. Thus, information technology (IT) managers are often careful in placement of electronic equipment, such as servers and switches, so that the equipment can be properly cooled and not exceed power requirements for a given location.

For medium to large complexes, IT managers have a significant burden in tracking and managing available spaces on the racks for mounting electronic equipment. Commercially available database management software programs can assist IT managers in management of the available spaces. Such programs include Vista 500™ available from Aperture Technologies, Inc. of Stanford, Conn., or Rackwise™ available from Visual Network Design, Inc. of Burlingame, Calif. These design software programs are initially predictive of estimated available space, heat loads, weight, and power requirements. This data is based off the electronic device nameplate ratings. Then, as the spaces are populated, an operator usually enters the data of the particular electronic equipment with its installed location into the software. The software can then provide a correspondingly updated predictive model to assist the IT manager in assessing the available spaces, heat loads, and power availability. However, it is understood that the system does not provide actual and direct feedback to the software program and thus can only provide such information based on the operator input. If the data is incorrectly entered, so that equipment is actually in a different location, then the software predictive capabilities are based on error and are potentially harmful by providing misleading information. It is not uncommon for electronic equipment to be assigned to a given location in a rack, but the operator is unable to install the equipment in that location because a previous operator installed an earlier piece of electrical equipment in that location. The technician then installs the new equipment in yet a different location than intended and the data is not updated in the records, thus perpetuating the problem. Additionally, it is not uncommon for equipment to migrate from location to location or rack to rack as the IT computing environment is chaotic and ever changing. Thus, tracking these changes is difficult, labor-intensive, and time consuming.

Therefore, there remains a need for an improved system and method to provide actual data of installed electronic equipment to allow actual tracking of available locations from remote facilities without necessitating physical on-site determination of available locations.

BRIEF SUMMARY OF THE INVENTION

The present invention provides an intelligent track system generally mounted in a network, server, or telecom rack/enclosure rack rail that can sense the spaces, such as "U" spaces, used by electronic equipment, shelving, or blanking panels and provide such information to a remote location. Information technology (IT) managers and other decision-makers can remotely view the actual available spaces and determine appropriate locations for installing additional equipment. Criteria can be based on actual available space and for some embodiments in conjunction with predictive or actual sensed temperatures proximate to the spaces, available cooling capacity, power loads, and available power capacity. In at least one embodiment, the intelligent mounting track system can include a plurality of sensors mounted along the rack surfaces that collectively or individually uniquely identify which spaces are occupied. The information can be communicated to an electronic processor with software to interpret the data and indicate space utilization.

The disclosure provides a system for indicating the presence of electronic equipment, shelving, blanking panels, or a combination thereof, comprising: a rack having a plurality of mounting spaces adapted to mount a plurality of electronic devices, shelving, or blanking panels; a plurality of sensors coupled to a rack along a length of the rack in alignment with the spaces, at least one sensor having a characteristic uniquely identified with the sensor to differentiate the sensor from other sensors coupled to the rack, and a location of the at least one sensor is known relative to the rack; at least one communication link coupled to the at least one sensor; and an electronic processor coupled to the communication link and adapted to receive information from the at least one sensor and determine a location of at least one electronic device, shelving, or blanking panel mounted to the rack by correlation to the location of at least one sensor when the at least one electronic device, shelving, or blanking panel is mounted to the rack.

The disclosure also provides a method for indicating the presence of electronic equipment, shelving, a blanking panel, or combination thereof, coupled to one or more mounting spaces in a rack, the rack having a plurality of sensors coupled to the rack and corresponding to the spaces along a length of the rack, and at least one conductive element coupled to at least one sensor with a location of the at least one sensor known relative to the rack, comprising: mounting at least one electronic device, shelving, or blanking panel to at least one of the mounting spaces in the rack; causing at least one of the sensors to receive information by the mounting of the at least one electronic device, shelving, or blanking panel, the at least one sensor having a unique characteristic to differentiate the sensor from other sensors coupled to the rack and the sensor having a known location; communicating the information about the mounting of the at least one electronic device, shelving, or blanking panel to an electronic processor; and establishing a location of the at least one electronic device, shelving, or blanking panel mounted to the rack based on the location of the at least one sensor.

BRIEF DESCRIPTION OF THE SEVERAL VIEWS OF THE DRAWINGS

A more particular description, briefly summarized above, may be had by reference to the embodiments illustrated in the appended drawings, forming part of the present specification and described herein. It is to be noted, however, that the appended drawings illustrate only some embodiments described herein and are therefore not to be considered limiting of the disclosure's scope, in that there can be other equally effective embodiments.

DETAILED DESCRIPTION

Applicants have created an intelligent mounting track system that can sense the "U" spaces used by electrical equipment, such as on a rack in an electrical cabinet, and provide such information to a remote location. The information can be communicated to an electronic processor with software to interpret the information and indicate space utilization to assist information technology ("IT") managers and other decision-makers in determining more accurately available locations for additional equipment from remote locations without physical inspection.

Figure 1:
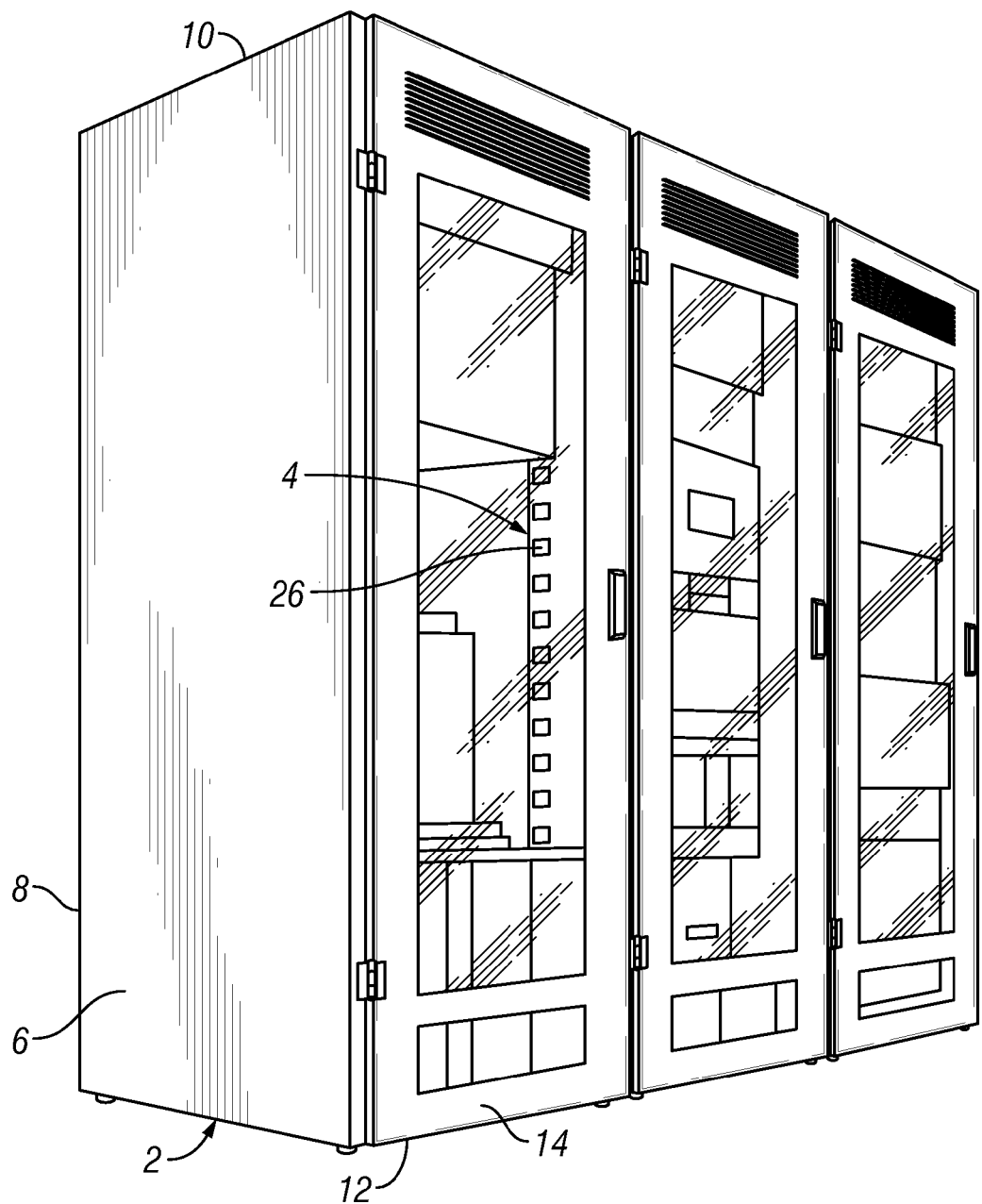
FIG. 1 illustrates in perspective view an existing stack of cabinets to support electronic equipment.
Figure 2:
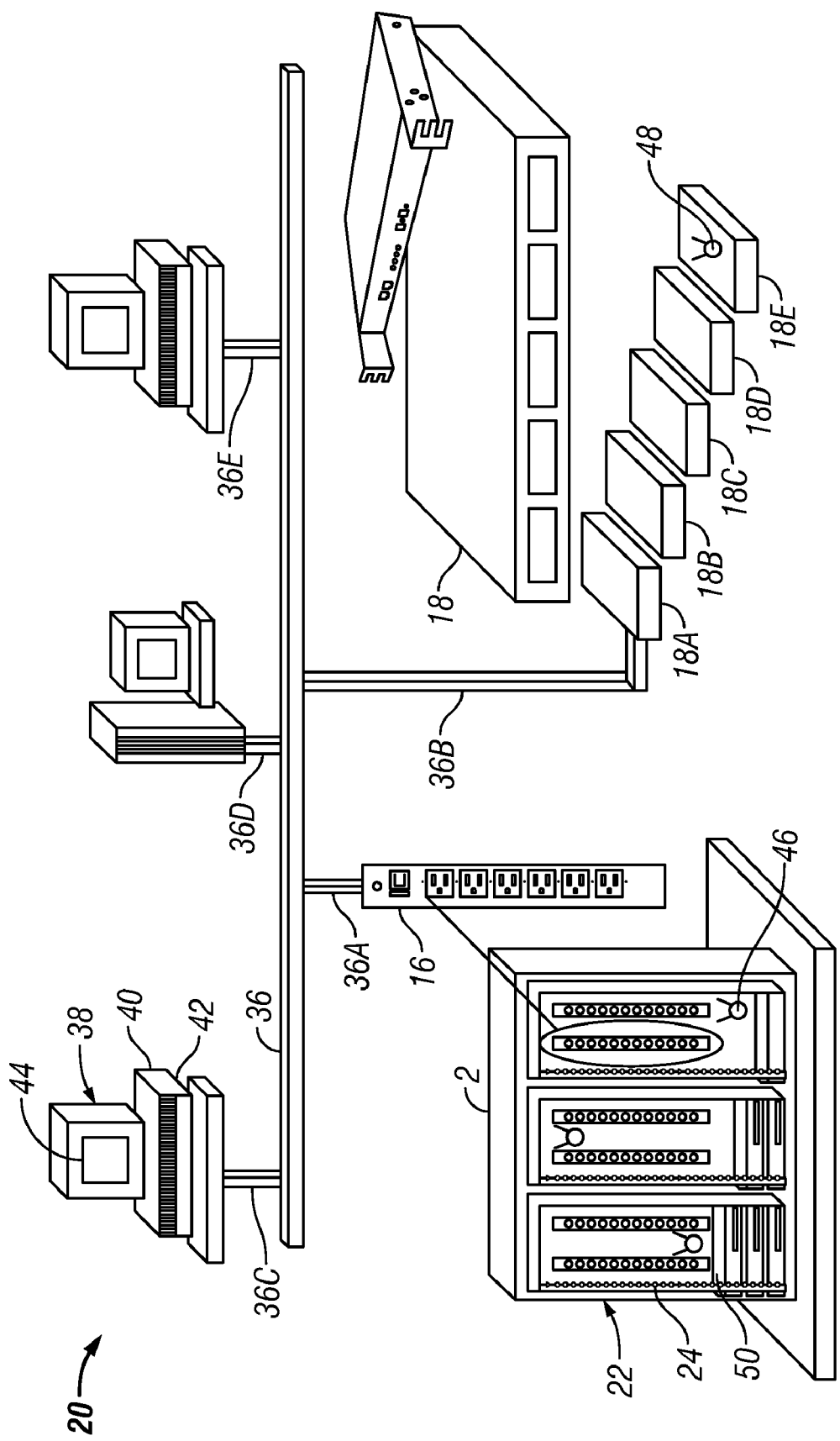
FIG. 2 is a schematic diagram of an exemplary system having an intelligent track system.

FIG. 2 is a schematic diagram of an exemplary system having an intelligent track system. The system 20 includes a rack with mounting spaces for mounting electronic devices, one or more sensors for sensing at least the presence of an electronic device, a communications link coupled to the sensor, and an electronic processor coupled to the communications link to receive information on the status of the sensor and the current location of at least one of the electronic devices mounted to the rack. Such electronic equipment can include servers, routers, and other devices generally associated with computer and electronic systems. The term "coupled," "coupling," and like terms are used broadly herein and can include any method or device for securing, binding, bonding, fastening, attaching, joining, inserting therein, forming thereon or therein, communicating, or otherwise associating, for example, mechanically, magnetically, electrically, chemically, directly or indirectly with intermediate elements, one or more pieces of members together and can further include integrally forming one functional member with another. The coupling can occur in any direction, including rotationally.

More specifically, in an exemplary embodiment, one or more cabinets 2 can include one or more racks 22, each rack having a rack rail 24. The rack rail can have mounting spaces for attaching one or more electronic devices 50 to the rack rail. A grouping of such mounting spaces can be generally referenced using current terminology as a "U" space that generally includes three mounting spaces, shown in more detail in FIG. 4. It is to be understood, however, that such concepts of the present inventions are not limited to any particular number of spaces or the particular nomenclature of a "U", and such terminology is used for ease of reference with current terminology.

A power module 16 can provide power to the electronic devices mounted to the rack rail. Further, one or more wireless transceivers 46 can be coupled to the rack 22, such as on a cabinet surface. The term "transceiver" is used broadly herein to include a receiver, a transmitter, or a combination thereof. The wireless transceiver 46 can transmit various data received from the rack, the cabinet, or a combination thereof. Such characteristics can include, without limitation, a thermal load, such as cabinet temperature, electrical load, humidity, electronic device data from electronic devices mounted to the rack, and other information. In some embodiments, the information can be transmitted through wired systems.

A communication link 36 can provide communications between various components of the system 20. The communication link can include an ethernet, a local area network, wide area network, and other network configurations known to those with ordinary skill in the art. The communication link 36 is to be construed broadly and includes wired and/or wireless systems and communications capabilities. The communication can occur through various modes and software including, without limitation, Hyper Tech Transfer Protocol (HTTP), Simple Network Management Protocol (SNMP), through email, or through BAC/IP (Back Net Over IP), and other communication protocols. The communication link can include branch communication links. For example, a communication link 36A between the power module 16 and other components of the system can provide information on the electrical load from the devices coupled thereto. Such information can provide data to correlate or calculate the electrical loads and compare electrical load capacities of the particular rack to which one or more electronic devices are mounted. In some embodiments, the electrical load can be used to provide information on the thermal load as well.

The communication link 36 can provide information to an interface 18 having various modules for directing input and output, digital and analog signals, receiving wireless communications, providing internet communications, and other functions. The interface 18 can communicate with other components of the system through a communication link 36B. One such suitable interface is known as an IntelliRack produced by Liebert Corporation of Columbus, Ohio. The IntelliRack system is designed to accept modules that can perform the various functions such as those referenced above. For example, without limitation, an interface module 18A can include a link card adapted to gather data and output information to a web network. An interface module 18B can be an Intellislot-4 having an EIA 232 interface. An interface module 18C can include an input/output card, such as one that is particularly adapted to receive analog and digital inputs. Similarly, an interface module 18D can also be an Intellislot input/output card designed to provide additional output to various other components of the system. An interface module 18E can accept wireless data for communicating such data to other system components. The interface module 18E can be coupled to a wireless transceiver 48.

One or more electronic processors 38 can be used to process information provided from the rack 22, directly or through the interface 18. The electronic processor 38 generally includes a processing portion 40 that can execute the programs and perform system and data integrity checks, and may be software, firmware, or hardware based. The electronic processor 38 also generally includes a memory portion 42. The memory portion 42 can be integral to the electronic processor 38 or separate therefrom. Further, the memory portion 42 can be located distally from the processing portion 40 and coupled through electronic communications. The memory portion 42 can include various types of memory, such as dynamic, random access, read-only, and other electronic data storage media and systems. The memory portion 42 can further store the various software programs used by the processing portion 40. An output 44, such as a display, can provide information to the decision-maker. The processor can be coupled to the communication link 36 through a communication link 36C. The communication link 36 can also provide the data to other processors either on site or at remote locations. In some cases, the processors can include network management systems through software, firmware, or hardware. The electronic processor 38 can examine and determine space availability for electronic devices to be coupled to the rack. Further, the electronic processor can be used to provide data on the system characteristics, such as electrical and thermal loads and other characteristics. The electronic processor can also be used to track the particular electronic device installed in a particular rack location, if the identity of the electronic device is provided and traced. Thus, if the electronic device is moved from location to location, the processor can provide such data to a decision-maker.

Various software can be used to display a system status of the various components, including the status of electronic devices mounted to particular rack locations, the status of the thermal and/or electrical loads, and other information. The data can be displayed in what is commonly known as a "dashboard." One available dashboard is known as OpenComms Nform which provides monitoring by network infrastructure. The software is available from Liebert Corporation. Some dashboards can include a monitoring program, such as SiteScan Web also available from Liebert Corporation.

Figure 3:
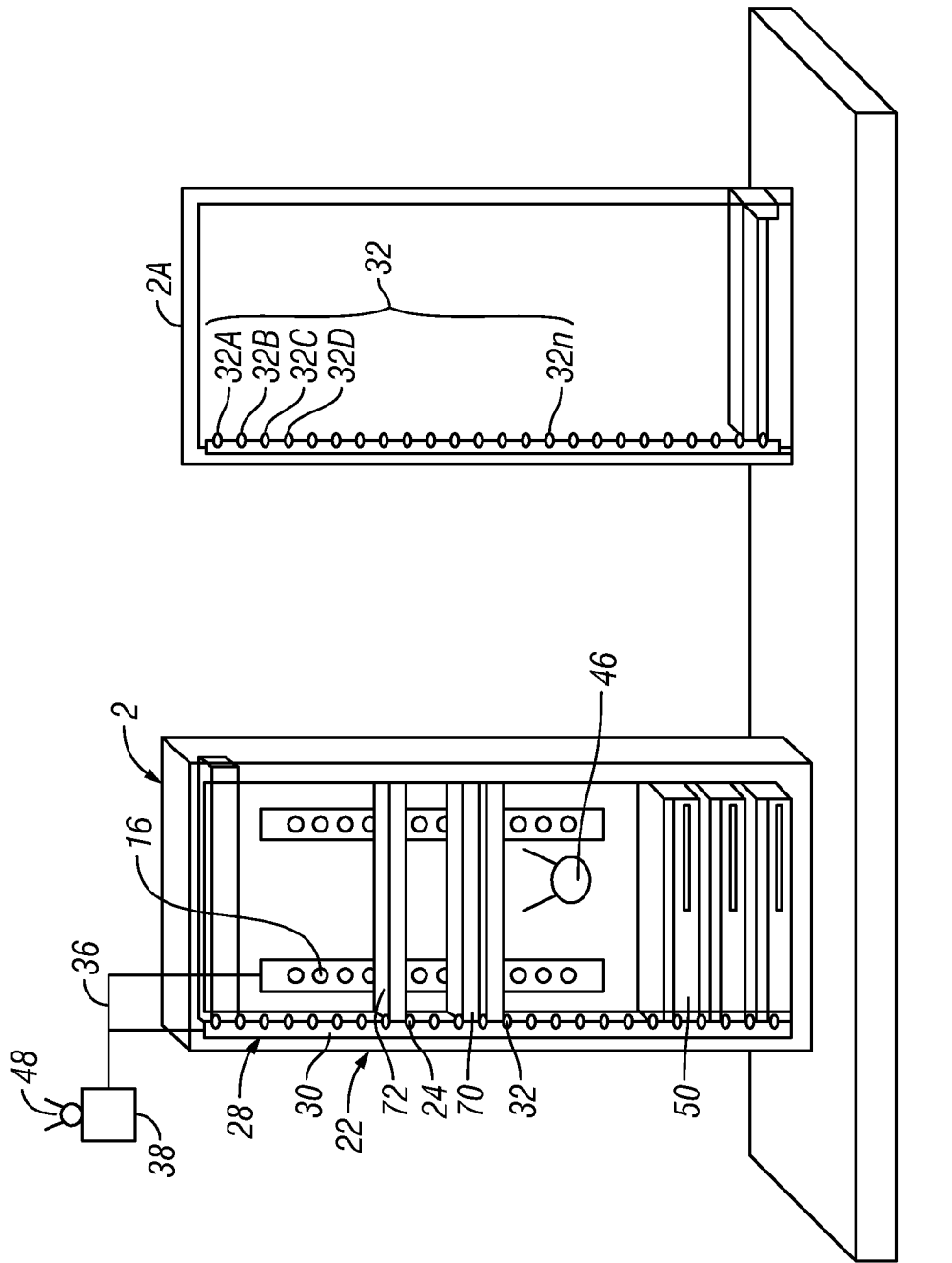
FIG. 3 is a schematic diagram of the cabinet and rack of the exemplary system of FIG. 2.

FIG. 3 is a schematic diagram of the cabinet and rack of the exemplary system of FIG. 2. FIG. 3 provides additional details of the rack. The system 2 includes one or more racks 22 with a rack rail 24. A track sensor system 28 can be mounted to the rack rail 24. The track sensor system 28 can include a plurality of sensors 32 distributed along a track 30. A power module 16 can be mounted to the cabinet 2 to provide power for electronic devices mounted to the rack. The track sensor system 28 can provide information to an electronic processor 38 and the communication link 36. Further, the power module 16 can also provide information on electrical load to the processor 38, where a transceiver 46 coupled to the electrical load can transmit data to a transceiver 48 coupled to the processor. The wireless transceiver 46 can provide further or other information as is appropriate for the particular system to the processor 38.

A cabinet 2A illustrates a plurality of the track sensors 32A, 32B, 32C, 32D, through 32N, collectively referenced herein as sensor or sensors 32. As will be described below, an electronic device 50, blanking panel 70, or shelving 72, or a combination thereof that are mounted in one or more of the available rack positions can cooperate with the one or more sensors 32, so that the system can determine the presence of an electronic device mounted to the particular location correlating to the particular sensor.

Figure 4:
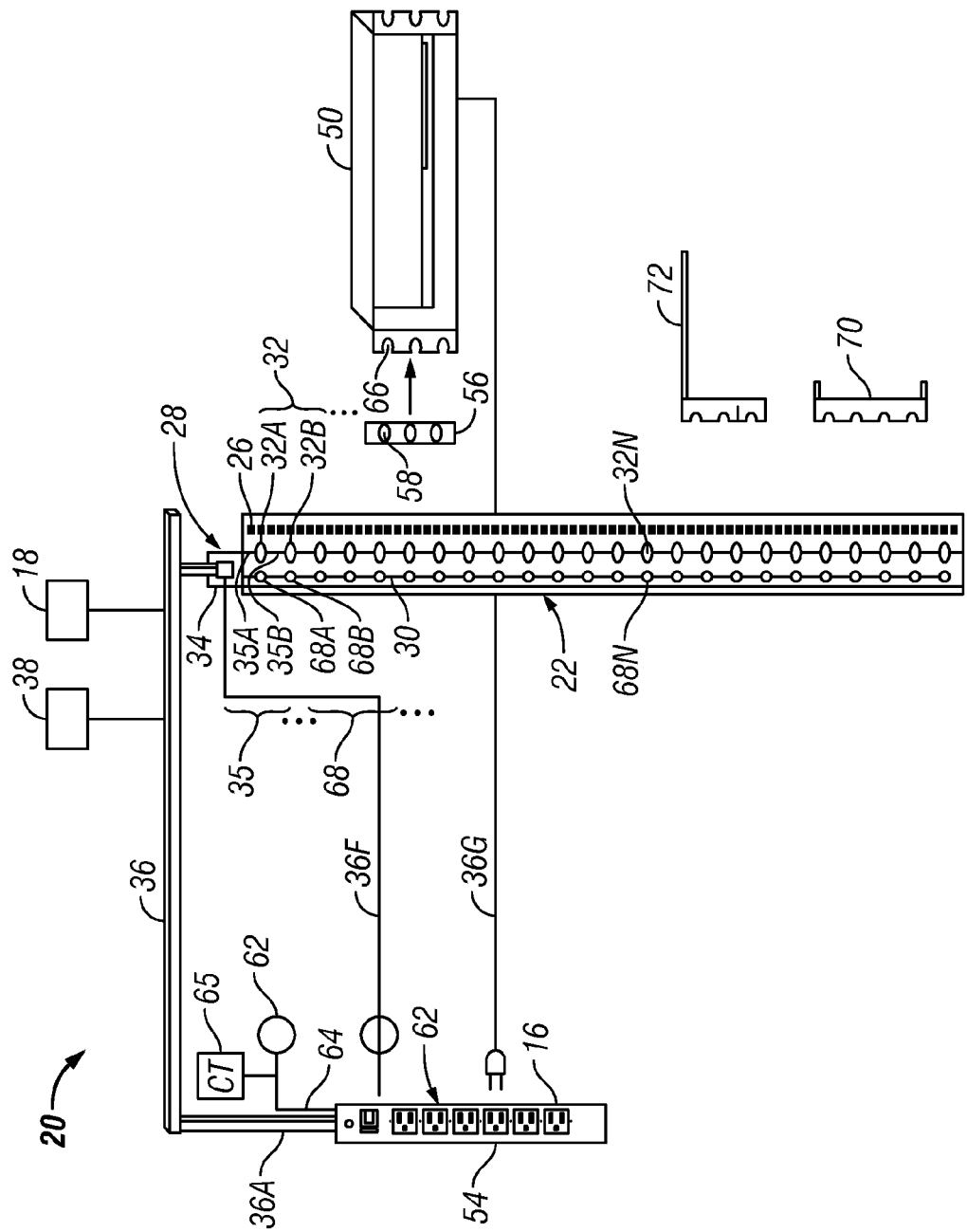
FIG. 4 is a schematic diagram of details of the intelligent track system of FIGS. 2 and 3.

FIG. 4 is a schematic diagram of details of the intelligent track system of FIGS. 2 and 3. The schematic illustrates at least one embodiment that is able to track the location of one or more particular electronic devices 50 mounted to the rack 22 at various spaces 26. Such spaces are generally defined in current terminology as a "U" space that generally includes three mounting spaces 26. It is to be understood, however, that such concepts of the present inventions are not limited to any particular number of spaces or the particular nomenclature of a "U", and such terminology is used for ease of reference with current terminology. By tracking the locations of electronic devices, a decision-maker can determine the availability of open locations for electronic equipment. When the electronic device 50 is mounted to the rack 22, the one or more sensors 32 can provide data to the electronic processor 38 and/or the interface 18 for further processing and communication to the electronic processor 38. The track sensor system 38 can include a strip of sensors electrically coupled to one or more busses or other conductive elements 35A, 35B, and other paths. Each sensor generally has a unique characteristic that allows the system to identify the particular sensor from other sensors in the rack and possibly from other racks. Without limitation, each sensor can be numbered to correspond to various "U" number indications on the track 30 of the track sensor system 28.

Further, the track sensor system 28 can include a microcontroller 34 with communication capabilities to transfer data through a communication link 36F and then to the communication link 36. The communication can occur directly to the communication link 36 or through the power module 16, if the power module has such capabilities, or a combination thereof. For example, the power module can indicate a "smart power chip" that includes sensors 54 for sensing electrical loads on the power module 16. Such electrical loads can be sensed on an individual electrical load basis or for the overall power module. The power module 16 can communicate such information through a communication link 36A to the overall communication link 36, and then to the processor 38 and/or interface 18.

In one embodiment, the sensor 32 can include a resistance sensor that senses the conductive presence of an electronic device mounted to the location corresponding to the associated sensor. By mounting the electronic device, the sensor can be contacted, pressed, or otherwise activated to contact a conductive element, such as conductive elements 35A, 35B, to indicate a change in resistance in the presence of a device mounted thereto. For example, a voltage can be applied to the conductive element to establish a first resistance in a first mode. When the sensor is activated and contacts the conductive element in a second mode, a change in the conductive path and a change in resistance occurs. Further, for example and without limitation, each sensor could have a unique resistance characteristic so that a change in resistance could be mapped to the respective sensor and identify the particular location of the change. The change can be registered with the processor 38 to indicate the presence of an electronic device. In some embodiments, the change can indicate the presence of a device with little to no knowledge of the particular specifics of the device, such as a model and serial number.

In another embodiment, the sensor can be activated to accept non-contact or non-conductive information, such as from radio frequency identification technology ("RFID"). For example, the sensor can be an RFID reader that can receive signals from an RFID identifier 56. The RFID identifier 56, such as an RFID tag, can be mounted to the electronic device 50. The sensitivity of the receiver and tag can be adjusted, so that the receiver only receives a signal from the tag, if the electronic device is mounted in the location that corresponds to the particular receiver. In at least one exemplary embodiment, a mounting scheme for an electronic device is through one or more device mounting openings 66 which can be mounted to rail 22 in a given "U" space. The identifier 56 can include, for example, one or more sensor mounting openings 58 aligned with the one or more device mounting openings 66 to facilitate mounting the electronic device to the rack in the relevant spaces 26 with the identifier 56.

The sensor resistance, and RFID reader and tag are exemplary and non limiting embodiments. Another example could include a sensor having a magnetic reader to sense a change in an associated magnetic field with the mounting of the electronic device. The change can be communicated through the system. Other examples of tracking technologies can be used and are contemplated.

The corresponding sensors 32 can sense the presence of the electronic device and provide information on the presence of the electronic device throughout the system 20. Without limitation, the identifier 56 can be coupled to the electronic device 50 in a variety of ways. For example, the identifier can be coupled by an adhesive, fastened through a screw, rivet, or both, or other mounting hardware. In general, the identifed 56 will remain with the electronic device 50. Therefore, if the device moves from one U space to another U space within a rack, or from one rack to an alternative rack, the location of the electronic device can be tracked through the system 20. The identifier can also be used at other resource areas related to the system 20, such as at a repair station or in an inventory room. The identifier 56 can further include other information specific to the electronic device, such as historical information on repair, usage, health, as well as identification information such as model number, serial number and application to which the electronic device is assigned. The data can be communicated through communication links, such as communication link 36G. The communication link 36G can, for example, represent a power line between the power module 16 and the electronic device 50 using technology that communicates information over the power line at frequencies other than the line frequency.

Similar arrangements with sensors and identifiers can be used with one or more blanking panels 70. A blanking panel 70 can fill unused vertical space in a rack to better control the air flow through the rack. The blanking panel 70 can be associated or otherwise coupled to one or more sensors 32 to indicate its presence similar to the electronic device 50, with the general exception that specific data regarding the unit may not be communicated via a communication link 36G as can be done for the electronic device. For example, the relevant sensor can be pressed a predetermined number of times to indicate the presence of the blanking panel for that sensor. If the blanking panel extends over multiple sensors, then multiple sensors can be actuated. Shelving 72 can also be used in the system and its presence indicated through the associated one or more sensors 32.

In a further embodiment, the track sensor system 28 can include one or more configuration controls 68, such as 68A, 68B, through 68N. For example, each sensor 32 can include a corresponding configuration control 68. The configuration control can include, without limitation, a button that can be pressed by an operator or can be activated by some other device that can be operated either manually or automatically from a remote site. For example and without limitation, the control button can be used to activate a corresponding sensor 32 or can be used to override the sensor and indicate that the space is occupied by a blanking panel 70, shelving 72, or provide some other occupied indication. The indicator can change colors depending on the particular mode in which it is used.

A power supply 62 can provide power through a power feed 64 to the power module 16. The power supply can be an AC power supply, DC power supply, or a combination thereof. In some embodiments, a power usage sensor 65 may also be provided in the system 20. The power usage sensor 65 may be adapted to sense a power usage of the rack 22 and provide power usage input to the electronic processor 38. Such a power usage sensor 65 may comprise a current transformer (CT) coupled at least partially around the power feed 64 to the rack 22. As is known in the art, the current transformer 65 may be adapted to sense a magnetic field around the power feed 64 dependent on an amount of current therethrough.

Figure 5:
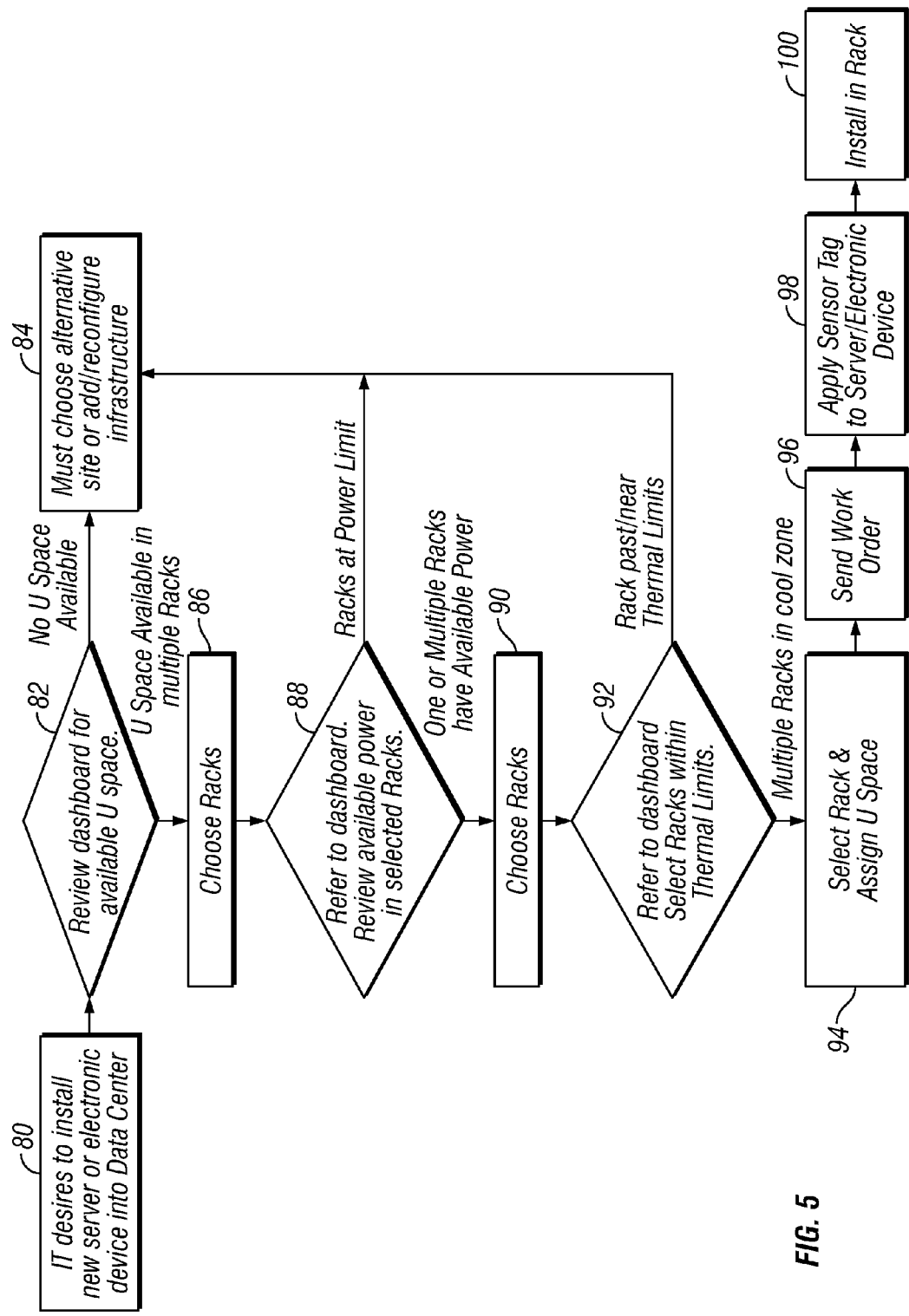
FIG. 5 is a schematic flowchart of a decision process for remotely selecting the appropriate location for equipment.

FIG. 5 is a schematic flowchart of a decision process for remotely selecting the appropriate location for equipment. The flow chart illustrates an exemplary decision process for locating new equipment. It is to be understood that the decision process could be modified as is known to those with ordinary skill in the art to include relocation of equipment, reinstallation of equipment that has been repaired, the need for servicing equipment based upon performance of the equipment at the installed location, and other decision processes that stem from the system described above. Thus, the illustrated flow chart is only exemplary and provided for the convenience of the reader. Further, the decisions can be made by a human operator or automatically through logic functions that can be programmed or learned by electronic processors. Thus, whether manual or automatic, the decision is made by a decision-maker.

A block 80 signifies the desire of a decision-maker to install a new server, a repaired server, a different server, or other electronic device into a data center. A decision block 82 indicates that the decision-maker reviews information available from the processor 38 described above to obtain possible available locations for mounting the electronic device. If no location is available, then as illustrated in block 84, the decision-maker can use an alternative site, or add or reconfigure the existing deployment and infrastructure of the electronic devices or system. If multiple locations are potentially available, then the decision-maker can choose one or more racks as shown in block 86. A decision block 88 shows that the decision-maker can review available power in the selected racks to see which rack or racks can support additional electrical loads. If all the racks are at their power limit, then the decision-maker returns to the block 84 that recommends choosing an alternative site or reconfiguring the infrastructure. If multiple racks are available and can support the electrical load, then block 90 indicates that a choice of the particular racks can be made. The system can be further queried in order to select qualified racks that have available power within allowable thermal limits for the particular rack. If all the racks are near their allowable thermal limits, then the decision is again referred to block 84 that recommends an alternative site or reconfiguration. If one rack has available power and is within its allowable thermal limit, then the decision can be made to use that rack and the particular available U space in block 94. If multiple racks still are suitable, then the decision-maker can select the rack from the available racks and the particular available U space.

Generally, a work order in block 96 is issued. An identifier, if appropriate, is coupled to the electronic device in block 98 and the electronic device is installed in the selected rack and U space in block 100. In other embodiments, the system can be configured to only monitor, for example, available space, and track different electronic devices based on the available space. Further, other embodiments can be configured to sense only the available space, and the available power or the allowable thermal limit, and make a decision based on such selected criteria. Further, a decision-maker may choose available space and power so that if only one rack was available, the decision may be made to choose that rack regardless of thermal limits. Other variations are possible.

The figures described above and the written description of specific structures and processes below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial implementation of the inventions are described or shown for the sake of clarity and understanding. Persons of skill in this art also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill this art having benefit of this disclosure. The inventions disclosed and taught herein are susceptible to numerous and various modifications and alternative forms. Further, the use of a singular term, such as, but not limited to, "a," is not intended as limiting of the number of items. The use of relational terms, such as, but not limited to, "top," "bottom," "left," "right," "upper," "lower," "down," "up," "side," and the like are used in the written description for clarity in specific reference to the Figures and are not intended to limit the scope of the invention or the appended claims. The term "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, directly or indirectly with intermediate elements or by wireless transmission, one or more pieces of members together and can further include without limitation integrally forming one functional member with another in a unity fashion. The coupling can occur in any direction, including rotationally.

Other and further embodiments utilizing one or more aspects of the inventions described above can be devised without departing from the spirit of Applicant's invention. For example, other embodiments of the system and method can include automatic selection of appropriate locations for given electronic equipment by using known spatial, thermal, power, and weight requirements of such equipment. Further, the various methods and embodiments of the intelligent track mounting system can be included in combination with each other to produce variations of the disclosed methods and embodiments. Discussion of singular elements can include plural elements and vice-versa.

The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants, but rather, in conformity with the patent laws, Applicants intend to protect fully all such modifications and improvements that come within the scope or range of equivalent of the following claims. Further, unless the context requires otherwise, the word "comprise" or variations such as "comprises" or "comprising", should be understood to imply the inclusion of at least the stated element or step or group of elements or steps or equivalents thereof, and not the exclusion of a greater numerical quantity or any other element or step or group of elements or steps or equivalents thereof.

What is claimed is:

1. A system for indicating the presence of electronic equipment, shelving, blanking panels, or a combination thereof, comprising:
   a rack having a plurality of mounting spaces adapted to mount a plurality of electronic devices, shelving, or blanking panels;
   a plurality of sensors coupled to the rack along a length of the rack in alignment with the spaces, at least one sensor having a characteristic uniquely identified with the sensor to differentiate the sensor from other sensors coupled to the rack, and a location of the at least one sensor is known relative to the rack;
   at least one communication link coupled to the at least one sensor; and
   an electronic processor coupled to the communication link and adapted to receive information from the at least one sensor and determine a location of at least one electronic device, shelving, or blanking panel mounted to the rack by correlation to the location of at least one sensor when the at least one electronic device, shelving, or blanking panel is mounted to the rack;
   wherein the electronic processor is further adapted to automatically evaluate one or more mounting spaces for mounting an electronic device in the rack based on one or more predefined criteria, the electronic processor configured to exclude a mounting space as a possible location for the electronic device if the mounting space fails the one or more predefined criteria, and include a mounting space as a possible location for the electronic device if the mounting space passes the one or more predefined criteria, the one or more predefined criteria including at least one of a predefined power limit and a predefined thermal limit.

2. The system of claim 1, wherein the sensor comprises a radio frequency identification reader and the electronic device comprises a corresponding radio frequency tag coupled to the electronic device, shelving, or blanking panel.

3. The system of claim 1, wherein the sensor comprises a magnetic reader adapted to sense changes in a magnetic field associated with mounting the electronic device, shelving, or blanking panel.

4. The system of claim 1, wherein the at least one sensor characteristic comprises a unique resistance.

5. The system of claim 4, further comprising a conductive element coupled to the at least one sensor wherein a change in a conductive path through the conductive element is caused when the electronic device, shelving, or blanking panel is mounted to the rack and activates the at least one sensor.

6. The system of claim 1, further comprising a thermal sensor adapted to sense a temperature of a volume adjacent the rack and provide temperature input to the electronic processor.

7. The system of claim 1, further comprising a power usage sensor adapted to sense a power usage of the rack and provide power usage input to the electronic processor.

8. The system of claim 7, wherein the power usage sensor comprises a current transformer at least partially coupled around a power feed to the rack and adapted to sense a magnetic field around the power feed dependent on an amount of current therethrough.

9. The system of claim 1, further comprising a wireless transmitter coupled to at least one of the sensors and adapted to wirelessly transmit at least some sensed information to the electronic processor.

10. A method for indicating the presence of electronic equipment, shelving, a blanking panel, or combination thereof, coupled to one or more mounting spaces in a rack, the rack having a plurality of sensors coupled to the rack and corresponding to the spaces along a length of the rack, and at least one conductive element coupled to at least one of the plurality of sensors, the at least one of the plurality of sensors having a known location relative to the rack, comprising:
mounting at least one electronic device, shelving, or blanking panel to at least one of the mounting spaces in the rack;
causing at least one of the sensors to receive information by the mounting of the at least one electronic device, shelving, or blanking panel, the at least one sensor having a unique characteristic to differentiate the sensor from other sensors coupled to the rack and the sensor having a known location;
communicating the information about the mounting of the at least one electronic device, shelving, or blanking panel to an electronic processor; and
establishing a location of the at least one electronic device, shelving, or blanking panel mounted to the rack based on the location of the at least one sensor;
wherein the electronic processor is adapted to automatically evaluate one or more mounting spaces for mounting an electronic device in the rack based on one or more predefined criteria, the electronic processor configured to exclude a mounting space as a possible location for the electronic device if the mounting space fails the one or more predefined criteria, and include a mounting space as a possible location for the electronic device if the mounting space passes the one or more predefined criteria, the one or more predefined criteria including at least one of a predefined power limit and a predefined thermal limit.

11. The method of claim 10, further comprising:
conducting electricity through the at least one conductive element to establish a first mode;
causing the at least one sensor to change a characteristic of a conductive path through the at least one conductive element to establish a second mode when mounting the at least one electronic device, shelving, or blanking panel;
providing information on the change in the characteristic to an electronic processor; and
establishing a location of the at least one electronic device, shelving, or blanking panel mounted to the rack based on correlating the change in the characteristic with the location of the at least one sensor.

12. The method of claim 11, wherein the at least one sensor comprises a unique resistance for the sensor, and the first mode comprises conducting electricity through the conductive element while bypassing the sensor resistance and the second mode comprises conducting electricity through the conductive element with the sensor resistance.

13. The method of claim 11, further comprising determining a temperature of a volume adjacent the rack and comparing the temperature to a temperature of a volume adjacent a second rack having spaces for electronic equipment.

14. The method of claim 13, further comprising determining a power usage of the rack and comparing the power usage to a power usage of a second rack having spaces for electronic equipment, shelving, or blanking panels.

15. The method of claim 11, further comprising determining a power usage of the rack and comparing the power usage to a power usage of a second rack having spaces for electronic equipment, shelving, or blanking panels.

16. The method of claim 11, further comprising wirelessly transmitting at least some sensed information on the change in the characteristic.

17. The method of claim 10, wherein the at least one sensor comprises an identification reader and providing identification information coupled with the electronic device and receivable by the identification reader when the electronic device is mounted to at least one space associated with the sensor.

18. The method of claim 17, wherein the identification reader is a radio frequency identification reader (RFID) and the identification information is associated with an RFID tag coupled with the electronic device.

* * * * *